US010771122B1

(12) United States Patent
Pasad

(10) Patent No.: US 10,771,122 B1
(45) Date of Patent: Sep. 8, 2020

(54) METHODS AND APPARATUS FOR DISCOVERING CODEWORD DECODING ORDER IN A SERIAL INTERFERENCE CANCELLATION (SIC) RECEIVER USING REINFORCEMENT LEARNING

(71) Applicant: Marvell World Trade Ltd., St. Michael (BB)

(72) Inventor: Kalpendu Ratanshi Pasad, Cupertino, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

(21) Appl. No.: 16/681,622

(22) Filed: Nov. 12, 2019

Related U.S. Application Data

(60) Provisional application No. 62/843,419, filed on May 4, 2019.

(51) Int. Cl.
| | |
|---|---|
| *H04B 7/04* | (2017.01) |
| *H04B 7/0413* | (2017.01) |
| *H04L 25/03* | (2006.01) |
| *G06N 20/00* | (2019.01) |
| *H03M 13/09* | (2006.01) |
| *H04B 1/12* | (2006.01) |

(52) U.S. Cl.
CPC ........... *H04B 7/0413* (2013.01); *G06N 20/00* (2019.01); *H03M 13/09* (2013.01); *H04B 1/12* (2013.01); *H04L 25/03019* (2013.01)

(58) Field of Classification Search
CPC ........ H04B 7/0413; H04B 1/12; G06N 20/00; H03M 13/09; H04L 25/03019
See application file for complete search history.

(56) References Cited

U.S. PATENT DOCUMENTS

| | | | |
|---|---|---|---|
| 2004/0081074 A1* | 4/2004 | Piechocki | H04L 25/024 370/206 |
| 2004/0165675 A1* | 8/2004 | Ito | H04L 1/005 375/267 |
| 2005/0031219 A1* | 2/2005 | Puri | H04N 19/523 382/250 |
| 2006/0039330 A1* | 2/2006 | Hackett | H04B 1/707 370/335 |

\* cited by examiner

*Primary Examiner* — Freshteh N Aghdam
(74) *Attorney, Agent, or Firm* — JW Law Group; James M. Wu

(57) ABSTRACT

Methods and apparatus for discovering codeword decoding order in a serial interference cancellation receiver using reinforcement learning. In an embodiment, a method is provided for decoding codewords in a multiple-input-multiple-output (MIMO) communication network. The method includes determining a decoding order based on a state space and a decoding policy, decoding selected codewords based on the decoding order, updating the decoding policy based on the decoding results and the state space, updating the state space based on decoding results, and updating the decoding order based on the state space and the decoding policy.

20 Claims, 6 Drawing Sheets

US 10,771,122 B1

METHODS AND APPARATUS FOR DISCOVERING CODEWORD DECODING ORDER IN A SERIAL INTERFERENCE CANCELLATION (SIC) RECEIVER USING REINFORCEMENT LEARNING

CROSS-REFERENCE TO RELATED APPLICATIONS

This application claims the benefit of priority from U.S. Provisional Application No. 62/843,419, filed on May 4, 2019, and entitled "Methods and Apparatus for Discovering Codeword Decoding Order in SIC Receiver Using Reinforcement Learning", which is herein incorporated by reference in its entirety.

FIELD

The exemplary embodiments of the present invention relate to telecommunications networks. More specifically, the exemplary embodiments of the present invention relate to receiving and processing data stream via a wireless communication network.

BACKGROUND

With the rapidly growing trend of mobile and remote data access over high-speed communication networks, such as LTE or 5G cellular services, accurately delivering and deciphering data streams has become increasingly challenging and difficult. High-speed communication networks, which are capable of delivering information include, but not limited to, wireless networks, cellular networks, wireless personal area network ("WPAN"), wireless local area networks ("WLAN"), wireless metropolitan area networks ("MAN"), or the like.

Systems that provide high-speed communication over multiple-input-multiple-output (MIMO) networks may utilize a Serial Interference Cancellation (SIC) receiver for equalization of MIMO channels. For example, a SIC receiver receives codewords transmitted over the MIMO channels and performs interference cancellation followed by a decoder to successfully decode the received codewords.

Therefore, it is desirable to efficiently decode received codewords in a MIMO system and to facilitate interference cancellation and decoding accuracy.

SUMMARY

In various embodiments, methods and apparatus are provided for discovering a codeword decoding order in a SIC receiver. For example, a plurality of codewords are received over a plurality of channels at a plurality of antennas of a MIMO receiver. A decoding order determination circuit obtains state information related to the channels and the codewords and a decoding policy and generates a decoding order. The decoding policy is learned using reinforcement learning based on a set of state metrics and rewards derived from decoding results. At every iteration, the decoding order determination circuit determines the codewords that are candidates for decoding in that iteration. A plurality of decoders implements the decoding order to decode the candidate codewords. At the conclusion of decoding, a reward is calculated and the policy is updated in response. The state information is updated to reflect the success or failure of the decoding attempt. The process is repeated until all the codewords have been decoded or other decoding condition is met. As the codewords are decoded, the channels associated with those codewords are removed from the channel equalization process, thereby allowing codewords on weaker channels to be accurately decoded.

In an embodiment, a method is provided for decoding codewords in a multiple-input-multiple-output (MIMO) communication network. The method includes determining a decoding order based on a state space and a decoding policy, decoding selected codewords based on the decoding order, updating the decoding policy based on the decoding results and the state space, updating the state space based on decoding results, and updating the decoding order based on the state space and the decoding policy.

In an embodiment, an apparatus is provided for decoding codewords in a multiple-input-multiple-output (MIMO) communication network. The apparatus comprises a decoding order determination circuit that determines a decoding order to decode codewords based on a state space and a decoding policy, and a reward determination circuit that receives decoded codewords and determines a reward based on decoding results. The apparatus also comprises a policy update circuit that updates the decoding policy based on the decoding results and the state space, and a state interface that updates the state space based on the decoding results. The decoding order determination circuit also generates an updated decoding order based on the state space and the decoding policy.

Additional features and benefits of the exemplary embodiments of the present invention will become apparent from the detailed description, figures and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
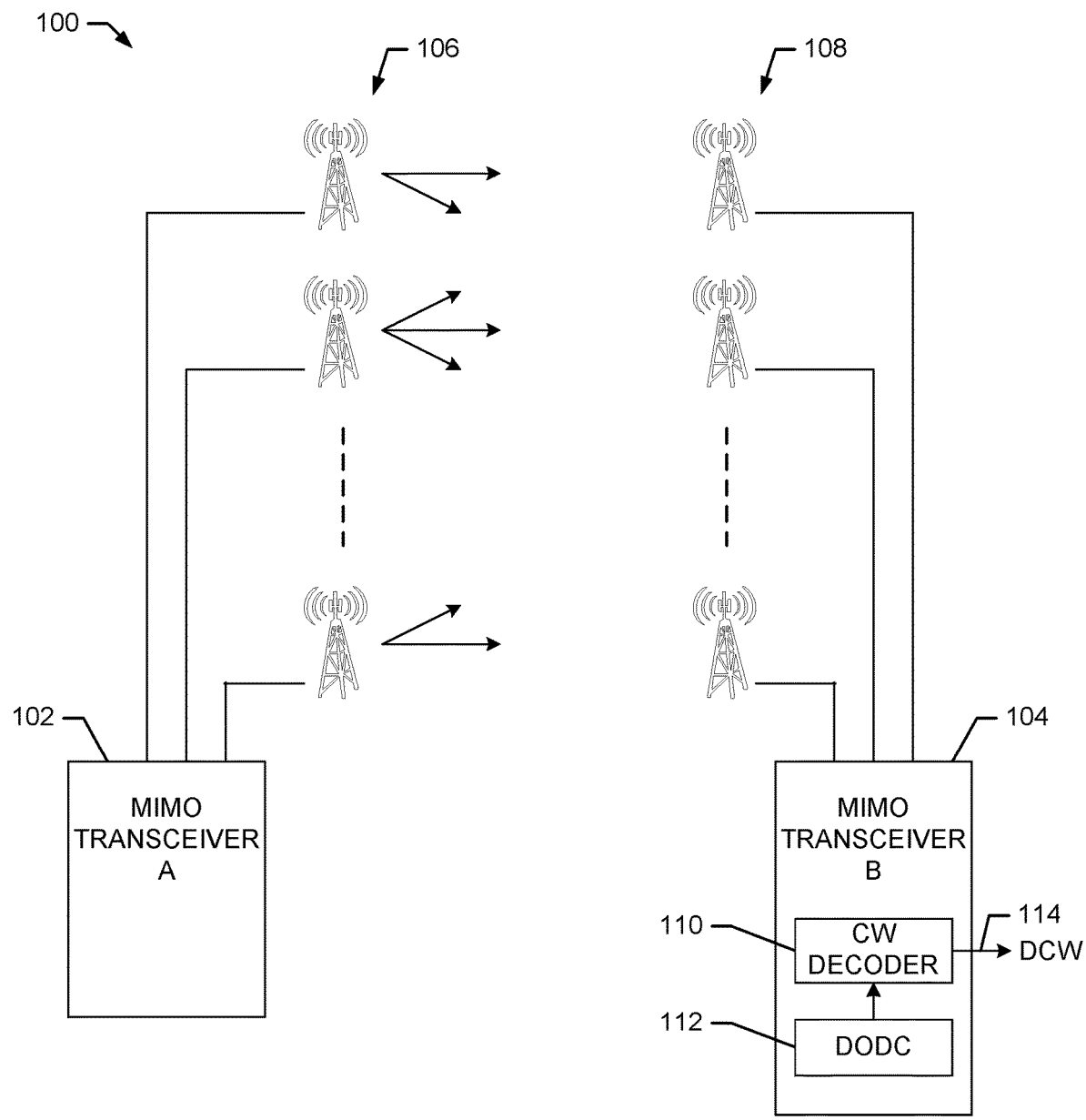
FIG. 1 shows a MIMO communication network having transceivers that include a decoding order determination circuit that operates to determine a decoding order for received codewords.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, subsystems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

In various embodiments, methods and apparatus are provided for discovering a codeword decoding order in a serial interference cancellation ("SIC") receiver using a process of reinforcement learning.

FIG. 1 shows a MIMO communication network 100 having transceivers that include a decoding order determination circuit (DODC) that operates to determine a decoding order for received codewords. The network 100 comprises a first MIMO transceiver 102 and a second MIMO transceiver 104. The first MIMO transceiver 102 is coupled to a plurality of antennas 106 that are used to transmit and receive information to/from the second MIMO transceiver 104.

The MIMO transceiver 104 is coupled to a plurality of antennas 108. The MIMO transceiver 104 receives codewords transmitted from the first transceiver 102 and received by the antennas 108. The transceiver 104 includes a codeword decoder 110 and a decoding order determination circuit (DODC) 112. Codewords that are received by the antennas 108 are processed by the transceiver 104 and decoded by the decoder 110. The decoded codewords (DCW) 114 are output to other entities coupled to the transceiver 104.

During operation, the order of decoding the codewords affects MIMO channel equalization. For example, decoding codewords received on strong channels allows those channels to be removed from the equalization process, thereby allowing codewords received on weaker channels to be successfully decoded. The DODC 112 operates to determine a decoding order so that MIMO channel equalization results in greater decoding accuracy.

In an embodiment, the DODC 112 uses a repetitive process, which can be referred to as "Reinforcement Learning" (RL) to determine the codeword decoding order to be used by the decoder 110. A more detailed description of the DODC 112 and its operation is provided below.

Figure 2:
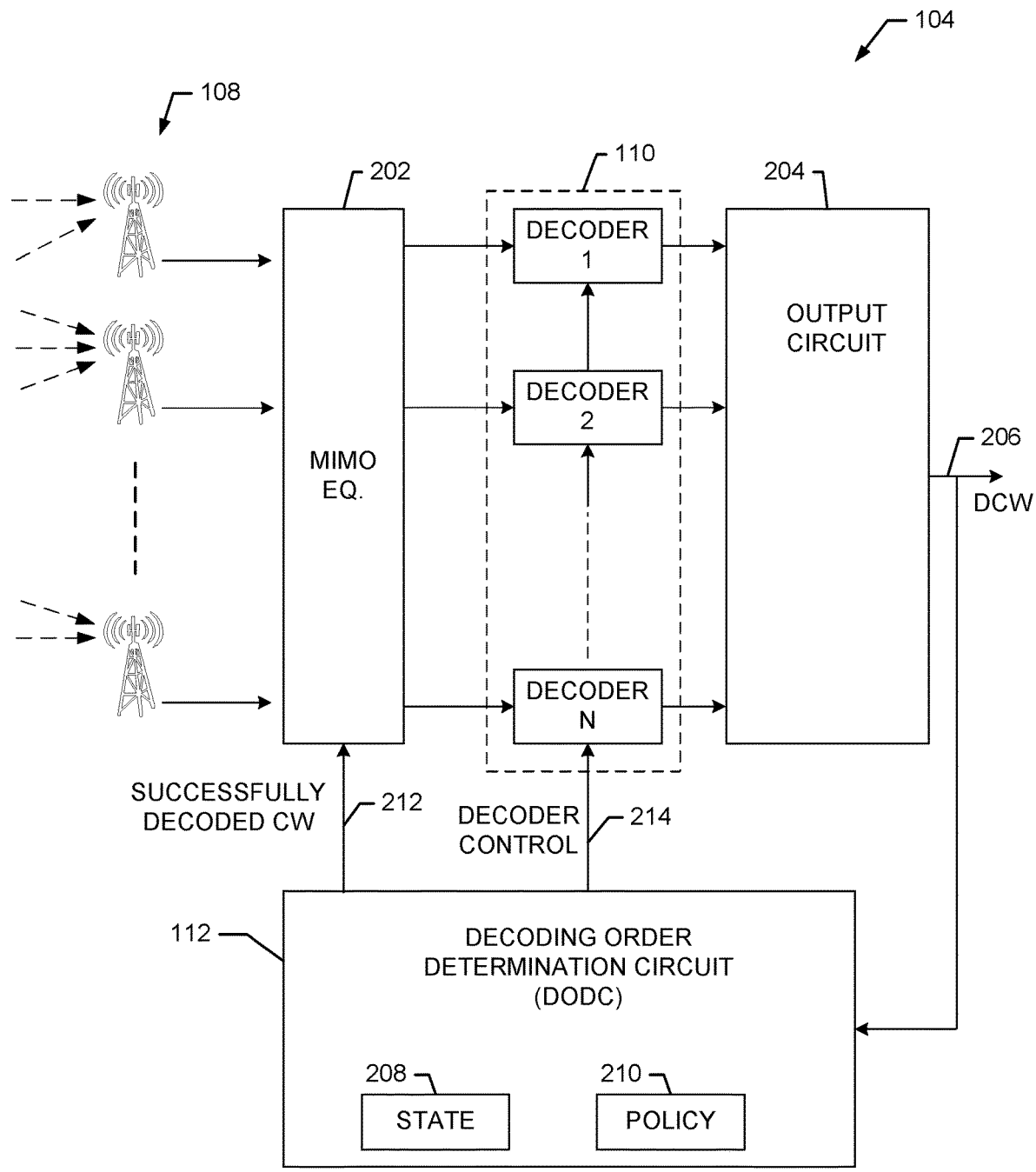
FIG. 2 shows a detailed exemplary embodiment of the second MIMO transceiver shown in FIG. 1.

FIG. 2 shows a detailed exemplary embodiment of the second MIMO transceiver 104 shown in FIG. 1. The MIMO transceiver 104 includes a MIMO equalizer 202 that is couple to the antennas 108. The MIMO equalizer 202 operates to equalize the channels received from the antennas 108. The equalized channels output from the MIMO equalizer 202 are input to the codeword decoder 110 that comprise a plurality of decoders (1-n). The decoders operate to decode the codewords that are received by the transceiver 104. The outputs of the decoders are input to an output circuit 204. The output circuit 204 provides the decoded codewords 206 to other processing elements of the MIMO transceiver. The decoded codewords 206 are also input to the decoding order determination circuit 112. The decoding order determination circuit 112 maintains state information 208 and policy information 210. During operation, the state information 208 is updated with state information that includes information about the received MIMO channels, noise levels, interference, signal-to-noise ratio, and/or other information regarding the received transmissions, channel conditions, and antenna information. The policy information 210 is used to determine a decoding order and is updated based on the decoding success.

During operation, the decoding order determination circuit 112 uses the policy information 210 and the state information 208 to determine a decoding order to be used by the decoders 110. For example, the DODC 112 outputs a decoder control signal 218 that enables/disables one or more of the decoders 110. Thus, the DODC 112 determines a decoding order and generates the decoder control signal 218 to control the decoders 110 to implement the decoding order.

In an embodiment, the output circuit 204 outputs the decoded codewords (DCW) 206, which are input to the DODC 112. The DODC 112 test each codeword to determine if it has been successfully decoded. For example, a cyclic redundancy check (CRC) is performed on the decoded codewords to determine if decoding was successful. Internal metrics including mutual information based on Extrinsic Information Transfer (EXIT) charts may be used in conjunction with CRC to determine rewards. Based on the success of the decoding operation, the DODC 112 determines rewards that are stored and used to update the policy information. The updated policy is used to determine subsequent decoding orders.

In an embodiment, the DODC 112 also updates the state information 208 with the results of the decoding operations along with other state parameters, such as updated channel estimates and signal-to-noise (SNR) information. The DODC 112 then utilizes the updated state information 208 and the updated policy information to determine a subsequent decoding order. Successfully decode codewords 216 are input to the MIMO equalizer 202 so that the channels associated with those codewords can be eliminated from the equalization process. The DODC 112 operates in a repetitive fashion until all the received code words have been successfully decoded or other decoding criteria have been met.

Figure 3:
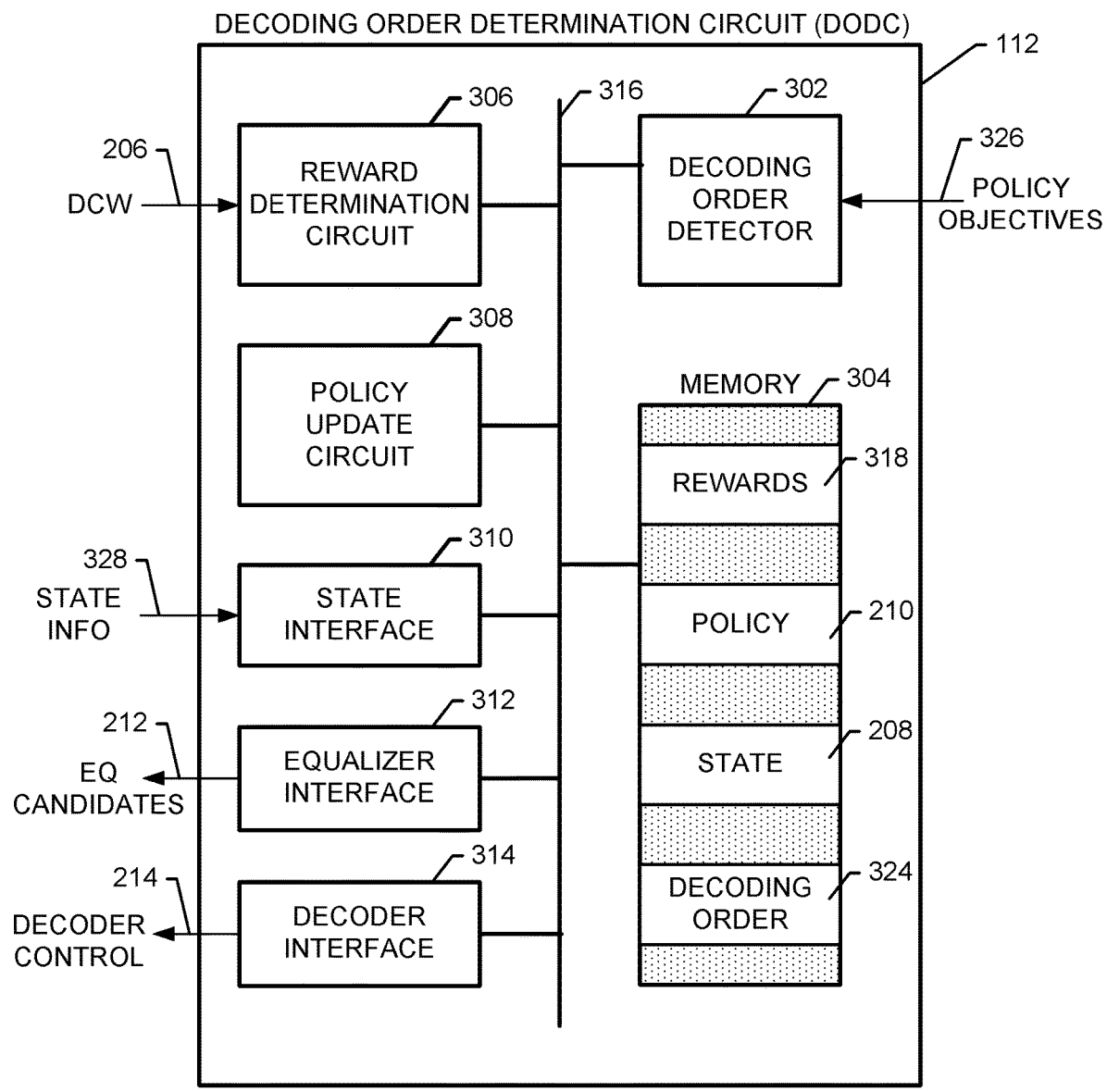
FIG. 3 shows an exemplary embodiment of the decoding order determination circuit shown in FIG. 2.

FIG. 3 shows an exemplary embodiment of the decoding order determination circuit 112 shown in FIG. 2. The circuit 112 comprises decoding order detector (DOD) 302, memory 304, reward determination circuit 306, policy updated circuit 308, state interface 310, equalizer interface 312, and decoder interface 314 all coupled to communicate over bus 316. The memory 304 comprises any suitable memory, such as RAM, and stores information for rewards 318, policy 210, state 208, and decoding order 324. In other embodiments the DOD 302 can be implemented in programmable logic or as a neural network.

In an embodiment, the DOD 302 comprises at least one of a processor, programmable logic, state machine, firmware, logic, and discrete components. During operation, the DOD 302 obtains the state information 208 and policy information 210 from the memory 304 and determines a decoding order 324 that is stored back into the memory 304. The decoding order 324 is also provided to the decoder interface 314, which generates a decoder control signal 214 that controls the operation of the decoders 110 to implement the decoding order. In an embodiment, the DOD 302 receives policy objectives 326 from another entity at the transceiver. The policy objectives 326 are used to update the policy 210 and/or configure how the policy 210 is applied.

After the decoding process, the decoded codewords are input to the reward determination circuit 306. In an embodiment, the reward determination circuit 306 comprises at least one of a processor, programmable logic, state machine, firmware, logic, and discrete components. The reward determination circuit 306 generates rewards based on the success of the decoding process. For example, the decoded codewords are analyzed using a CRC check, EXIT charts, and/or other information to calculate the rewards. The rewards 318 are generated for successfully decoded codewords and stored in the memory 304.

In an embodiment, the policy update circuit 308 comprises at least one of a processor, programmable logic, state machine, firmware, logic, and discrete components. The policy update circuit 306 obtains the rewards 318 from the memory 304 and processes the rewards to update the policy 210 in the memory 304.

In an embodiment, the state interface 310 receives a variety of state information from various entities at the transceiver. For example, the state interface 310 receives MIMO channel information, antenna information, noise levels, signal-to-noise ratios, and other information that is combined to form the state 208 that is stored in the memory 304. The state 208 also includes a list of codewords and status as to whether each codeword has been successfully decoded. In an embodiment, the state 208 is continually updated when new information is available.

The decoder interface 314 interfaces with the decoder 110 to provide the decoder control signal 214 that implements the determined decoding order. For example, the decoder control signal 214 enables and disables selected decoders to decode selected codewords according to the decoding order.

The equalizer interface 312 interfaces with the MIMO equalizer 202 to provide the EQ candidate signal 212 that indicates codewords that have been successfully decoded and therefore can be removed from the equalization process. In one aspect, a SIC receiver that provides for equalization of MIMO channel utilizes the iterative decoding of codewords followed by interference cancellation of the successfully decoded codewords. In an embodiment, the DOD 302 controls the equalizer interface 312 to output a new list of equalizer candidates which reflect that codewords on particular channels have been successfully decoded based on the state information 208.

Reinforcement Learning

In various embodiments, a reinforcement learning procedure is used for discovering the optimal order for decoding codewords that are candidates for decoding in each iteration. In one embodiment, various types of iterative procedures, such as a Markov Decision Process (MDP) can be employed. For example, the following procedure utilizes a state-action-reward procedure that can be defined as follows.

State Space

The state space 208 is maintained in the memory 304 and comprises at least the following.
1. A set containing all codewords that are not decoded, serial-candidates (s-cand)
2. A set containing all codewords that are successfully decoded, (s-success)
3. A set of metrics that reflects the channel condition seen by a codeword. This may include raw channel estimates, postprocessing SINR from the MIMO equalizer, functions of these, or any metric that reflects the quality of codewords in terms of its decodability (e.g., ability to be successfully decoded).
4. Coding rate of the codewords, modulation order of the data on the codewords Action Space The action space includes one or more codewords from a set of codewords to be decoded. These codewords will be scheduled for decoding.

Reward

A successful decoding of a codeword will results in a positive reward. An unsuccessful decoding will result in negative or a zero reward. If the codeword is composed of multiple code blocks then the successful decoding of a code block will contribute to a reward. For example, a successful decoding will remove that channel from the MIMO equalization process. In an embodiment, an internal decoder metric like the extrinsic information (EXIT charts) may be used in conjunction with a CRC check to determine rewards.

It should be noted that an optimal policy for the MDP, leading to a policy for the decoding order of codewords can be learned via any of a multitudes of reinforcement learning algorithms.

Figures 4, 5:
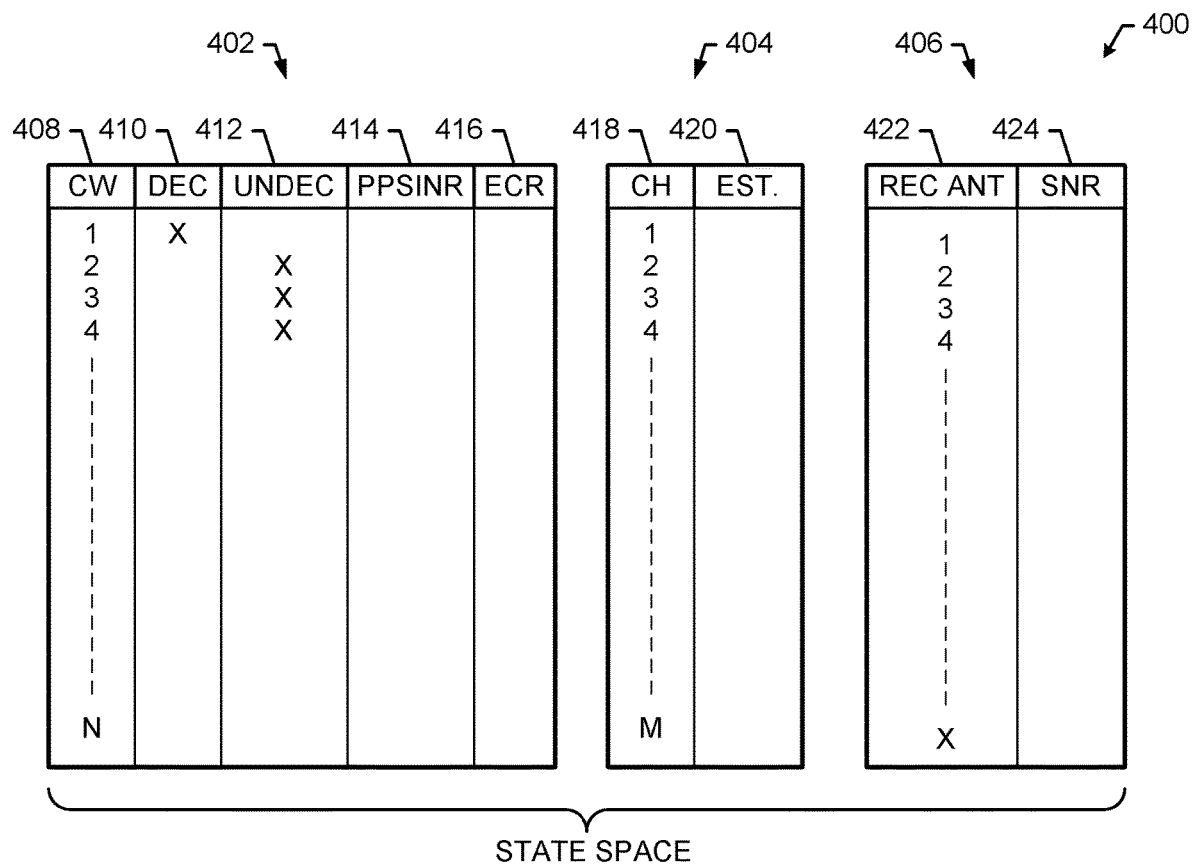
FIG. 4 shows an exemplary embodiment of a state space for use with the DODC shown in FIG. 3.
FIG. 5 shows an exemplary embodiment of a decoding policy for use with the DODC shown in FIG. 3.

FIG. 4 shows an exemplary embodiment of a state space 400. For example, the state space 400 is suitable for use as the state 208 shown in FIG. 3. The state space 400 includes a first section 402 that comprises codeword state information, a second section 404 that comprises channel state information, and a third section 406 that comprises antenna state information. It should be noted that the state space 400 is exemplary and not exhaustive of all the state information that may be utilized to form the state space.

The first section 402 comprises a codeword identifier 408, decoded indicator 410, undecoded indicator 412, post processing SINR 414, and effective coding rate 416. The second section 404 comprises a channel identifier 418 and a channel estimate 420. The third section 406 comprises a receive antenna indicator 422 and SNR values 424.

Other state information may also be associated with each codeword. As undecoded codewords are successfully decoded, the state space 400 is updated to identify the decoded codewords and to update other sections of the state space. Accordingly, as the decoding process continues, the undecoded codewords are systematically decoded according to the decoding order and marked as decoded until all of the codewords have been decoded or other decoding criteria is reached, such as the decoding iteration times out. The decoded codewords are provided to the MIMO equalizer which determines channels that can be eliminated from the equalization process.

FIG. 5 shows an exemplary embodiment of a decoding policy 500. For example, the decoding policy 500 is suitable for use as the policy 210 shown in FIG. 3. The decoding policy is utilized along with the state space 208 to determine a decoding order. The decoding policy is updated based on rewards determined from the decoding process. The decoding policy is updated at every iteration of the decoder loop, so that the decoding policy is dynamic and can change with a changing transmission environment. In an embodiment, the decoding policy utilizes (1) undecoded codewords, (2) post processing SINR, (3) channel estimates, (4) effective coding rate, (5) rewards, and (6) SNR. It should be noted that the decoding policy may utilize other parameters.

Figure 6:
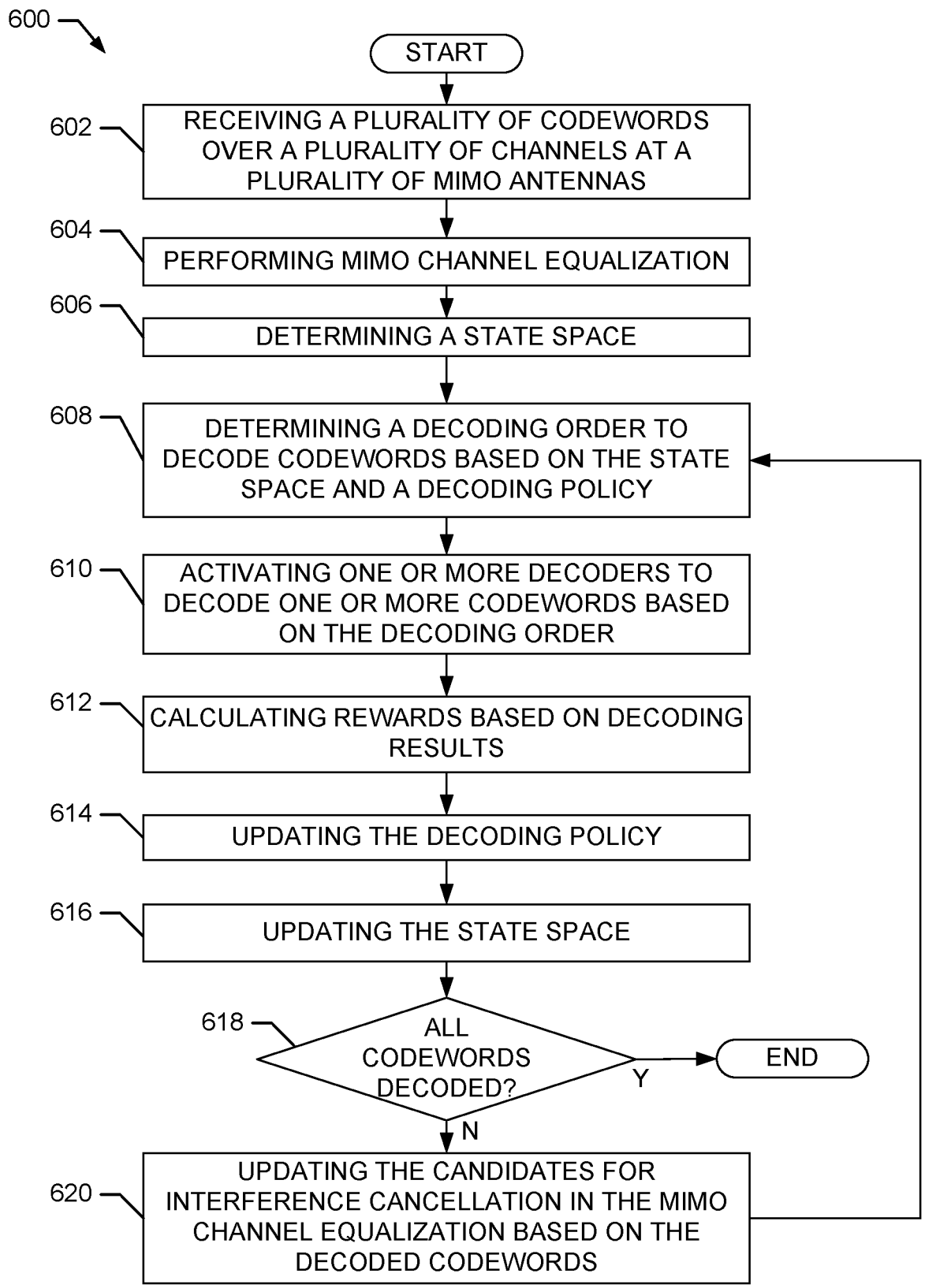
FIG. 6 shows an exemplary method for determining a decoding order in accordance with exemplary embodiments of the invention.

FIG. 6 shows an exemplary method 600 for determining decoding order in accordance with exemplary embodiments of the invention. For example, the method 600 is suitable for use with the DODC 112 shown in FIG. 3.

At block 602, a plurality of codewords are received over a plurality of channels at a plurality of MIMO antennas. For example, the codewords are received at the antennas 108 shown in FIG. 2.

At block 604, MIMO channel equalization is performed to equalize the channels of the received codewords. For example, the MIMO equalizer 202 performs the equalization.

At block 606, a state space is determined. For example, the state space is determined from state information 328 received by the DODC 112. The state space includes information about decoded and undecoded code words, channel estimates, SINR and other parameters as illustrated in the state space 400 shown in FIG. 4.

At block 608, a decoding order is determined to decode one or more code words based on the state space 208 and a decoding policy 210. For example, the decoding order 324 indicates the order in which codewords are decoded based on the current state 208 and policy 210. In an embodiment, the DOD 302 determines the decoding order 314 from the state 208 and the policy 210.

At block 610, one or more decoders are enabled to decode codewords based on the determined decoding order. In an embodiment, the DOD 302 determines the decoding order 324 and controls the decoder interface 314 to enable selected decoders 110 to decode codewords on selected channels. The decoded codewords are returned to the DODC 112 and received by the reward determination circuit 306.

At block 612, rewards are calculated based on the decoding result. For example, the reward determination circuit 306 calculates numerical rewards based on successfully decoded code words by performing a CRC check on the decoding results.

At block 614, the decoding policy is updated. For example, the reward determination circuit 306 calculates the rewards 318 based on decoding success or failure. The rewards 318 are stored in the memory 304. The policy update circuit 308 obtains the rewards 318 from the memory 304 and updates the policy 210 based on the rewards 318. In an exemplary embodiment, at iteration (n), the policy 210 is updated based on rewards in iteration (n) and past state information (i.e., state at iteration (n−1)). In response to the decoding results in iteration n, the state is updated for iteration n+1. At iteration (n+1), the updated policy at iteration (n+1), along with state at (n+1) is used for determining the new decoding order.

At block 616, the state space is updated. For example, the state 208 is updated by the DOD 302 with the results of the decoding and received state information. For example, successfully decoded codewords are marked in the state 208 and parameters for the channels and antennas are updated based on information received by the state interface 310.

At block 618, a determination is made as to whether all codewords have been successfully decoded. If all codewords have been successfully decoded, the method ends. In another embodiment, if a particular decoding condition is met, the method ends. For example, if a time-out condition occurs, the method ends. If all code words have not been successfully decoded, the method proceeds to block 620. For example, the DOC 302 determines whether or not all codewords have been successfully decoded.

At block 620, the candidates for interference cancellation are updated and sent to the equalizer. For example, channels associated with successfully decoded code words are sent to the MIMO equalizer 202 using the equalizer interface 312 so that these channel can be removed from the equalization process. The method then proceeds at block 608 to determine the next decoding order for the remaining undecoded codewords.

Thus, the method 600 operates to determine a decoding order for received codewords in a MIMO system. It should be noted that the operations of the method 600 are exemplary and that changes, modifications, additions, and deletions may be made within the scope of the embodiments.

Figure 7:
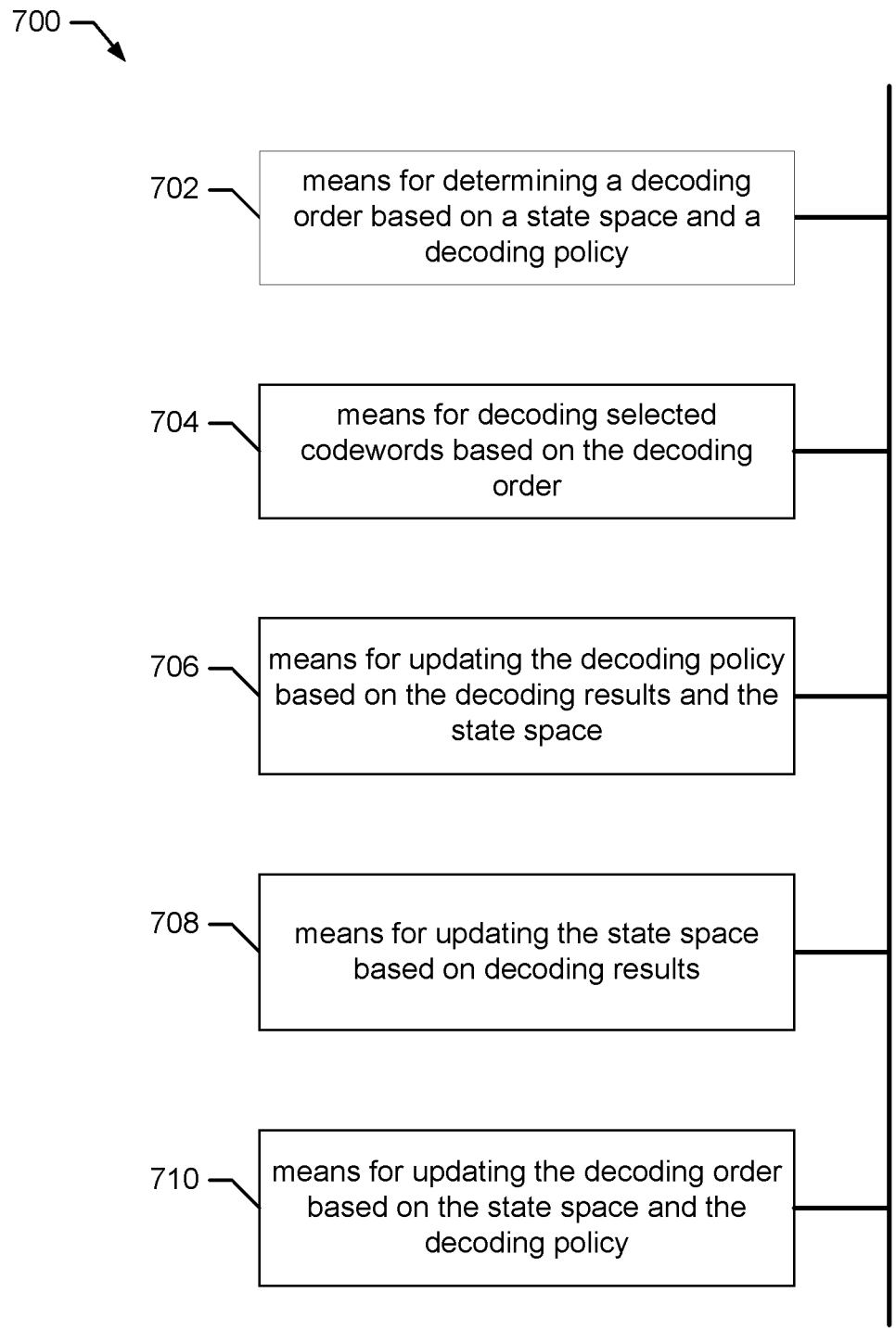
FIG. 7 shows an exemplary apparatus for determining a decoding order in accordance with exemplary embodiments of the invention.

FIG. 7 shows an exemplary apparatus 700 for determining decoding order in accordance with exemplary embodiments of the invention. For example, the apparatus 700 is suitable for use as the DODC 112 shown in FIG. 3.

The apparatus comprises means (702) for determining a decoding order based on a state space and a decoding policy, which in an embodiment comprises the DOD 302. The apparatus also comprises means (704) for decoding selected codewords based on the decoding order, which in an embodiment comprises the decoder interface 314. The apparatus also comprises means (706) for updating the decoding policy based on the decoding results and the state space, which in an embodiment comprises the policy update circuit 308. The apparatus also comprises means (708) for updating the state space based on decoding results, which in an embodiment comprises the state interface 310. The apparatus also comprises means (710) for updating the decoding order based on the state space and the decoding policy, which in an embodiment comprises the DOD 302.

While particular embodiments of the present invention have been shown and described, it will be obvious to those skilled in the art that, based upon the teachings herein, changes and modifications may be made without departing from these exemplary embodiments of the present invention and its broader aspects. Therefore, the appended claims are intended to encompass within their scope all such changes and modifications as are within the true spirit and scope of these exemplary embodiments of the present invention.

What is claimed is:

1. A method for decoding codewords in a multiple-input-multiple-output (MIMO) communication network, the method comprising:
   determining a decoding order based on a state space and a decoding policy;
   decoding selected codewords based on the decoding order;
   updating the decoding policy based on decoding results and the state space;
   updating the state space based on the decoding results; and
   updating the decoding order based on the state space and the decoding policy.

2. The method of claim 1, further comprising repeating the operations of claim 1 until a decoding completion criteria is met.

3. The method of claim 1, wherein the operation of decoding comprises activating one or more decoders based on the decoding order to decode one or more codewords.

4. The method of claim 1, wherein the operation of updating the decoding policy further comprises:
calculating a reward based on the decoding results and internal metrics; and
updating the decoding policy based on the reward.

5. The method of claim 4, wherein the operation of calculating the reward comprises:
assigning the reward a positive value for successfully decoded codewords; and
assigning the reward a negative value for unsuccessfully decoded codewords.

6. The method of claim 5, further comprising checking a decoded codeword cyclic redundancy check (CRC) value to determine decoding success.

7. The method of claim 5, wherein the operation of calculating the reward comprises determining the reward from a combination one or more of a number of successfully decoded codewords or code blocks within a codeword, a number of codewords or code blocks within a codeword that are not successfully decoded, and internal decoding metrics including extrinsic information related to the codewords.

8. The method of claim 1, further comprising receiving the codewords over a plurality of channels at a plurality of antennas.

9. The method of claim 8, further comprising equalizing the plurality of channels based on the decoding results.

10. The method of claim 1, wherein the operation of updating the state space comprises updating the state space based on one or more of successfully decoded codewords, unsuccessfully decoded codewords, post-processing signal-to-interference-plus-noise ratio ("SINR"), coding rate, channel estimate, and antenna signal-to-noise ratio (SNR).

11. The method of claim 1, further comprising updating the decoding policy based on policy objectives.

12. The method of claim 1, wherein the operation of updating comprises utilizing a neural network to update the decoding policy based on a reward.

13. An apparatus for decoding codewords in a multiple-input-multiple-output (MIMO) communication network, the apparatus comprising:
a decoding order determination circuit that determines a decoding order to decode codewords based on a state space and a decoding policy;
a reward determination circuit that receives decoded codewords and determines a reward based on decoding results;
a policy update circuit that updates the decoding policy based on the decoding results and the state space;
a state interface that updates the state space based on the decoding results; and
wherein the decoding order determination circuit generates an updated decoding order based on the state space and the decoding policy.

14. The apparatus of claim 13, further comprising one or more decoders that are activated by the decoding order to decode one or more codewords.

15. The apparatus of claim 13, wherein the policy update circuit updates the decoding policy by calculating a reward based on the decoding results and internal metrics, and updating the decoding policy based on the reward.

16. The apparatus of claim 15, wherein the policy update circuit calculates the reward by assigning the reward a positive value for successfully decoded codewords, and assigning the reward a negative value for unsuccessfully decoded codewords.

17. The apparatus of claim 16, wherein the policy update circuit calculates the reward by determining the reward from a combination one or more of a number of successfully decoded codewords or code blocks within a codeword, a number of codewords or code blocks within a codeword that are not successfully decoded, and internal decoding metrics including extrinsic information related to the codewords.

18. The apparatus of claim 13, further comprising an equalizer interface that equalizes a plurality of channels that convey the codewords based on the decoding results.

19. The apparatus of claim 13, wherein the state interface updates the state space based on one or more of successfully decoded codewords, unsuccessfully decoded codewords, post-processing signal-to-interference-plus-noise ratio ("SINR"), coding rate, channel estimate, and antenna signal-to-noise ratio (SNR).

20. An apparatus for decoding information in a multiple-input-multiple-output (MIMO) communication network, the apparatus comprising:
means for determining a decoding order based on a state space and a decoding policy;
means for decoding selected codewords based on the decoding order;
means for updating the decoding policy based on the decoding results and the state space;
means for updating the state space based on decoding results; and
means for updating the decoding order based on the state space and the decoding policy.

* * * * *